US011450644B2

(12) United States Patent
Kim et al.

(10) Patent No.: US 11,450,644 B2
(45) Date of Patent: Sep. 20, 2022

(54) SEMICONDUCTOR PACKAGE HAVING A REINFORCEMENT LAYER

(71) Applicant: SK hynix Inc., Icheon-si (KR)

(72) Inventors: Sung Su Kim, Icheon-si (KR); Byoung Jun Ahn, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 109 days.

(21) Appl. No.: 17/021,839

(22) Filed: Sep. 15, 2020

(65) Prior Publication Data

US 2021/0407965 A1 Dec. 30, 2021

(30) Foreign Application Priority Data

Jun. 25, 2020 (KR) .................. 10-2020-0077653

(51) Int. Cl.
  *H01L 25/065* (2006.01)
  *H01L 23/31* (2006.01)
  *H01L 23/00* (2006.01)

(52) U.S. Cl.
  CPC ...... *H01L 25/0657* (2013.01); *H01L 23/3121* (2013.01); *H01L 23/562* (2013.01); *H01L 2225/0651* (2013.01); *H01L 2225/06506* (2013.01); *H01L 2225/06562* (2013.01)

(58) Field of Classification Search
  CPC .................. H01L 2225/06562; H01L 23/562
  See application file for complete search history.

(56) References Cited

U.S. PATENT DOCUMENTS

2009/0218670 A1* 9/2009 Yamamoto ........ H01L 23/49838
257/690

FOREIGN PATENT DOCUMENTS

KR   1020190015097 A   2/2019
KR      101997548 B1   7/2019

* cited by examiner

*Primary Examiner* — Yu-Hsi D Sun
(74) *Attorney, Agent, or Firm* — William Park & Associates Ltd.

(57) ABSTRACT

A semiconductor package is provided. The semiconductor package may include a substrate, a chip stack disposed on the substrate, the chip stack including a plurality of semiconductor chips, a plurality of bonding wires electrically connecting the substrate to the plurality of semiconductor chips, a reinforcement layer disposed on the chip stack, and a molding layer surrounding side surfaces of the chip stack and the bonding wires and contacting side surfaces of the reinforcement layer. The reinforcement layer may include a lower layer including an adhesive, an intermediate layer disposed on the lower layer, and an upper layer disposed on the intermediate layer. The intermediate layer may have elongation in a range of 5% to 70%. The upper layer may have elongation less than 5%.

20 Claims, 5 Drawing Sheets

SEMICONDUCTOR PACKAGE HAVING A REINFORCEMENT LAYER

CROSS-REFERENCE TO RELATED APPLICATION

This application claims priority under 35 U.S.C. § 119(a) to Korean Patent Application No. 10-2020-0077653 filed on Jun. 25, 2020, which is incorporated herein by reference in its entirety.

BACKGROUND

1. Technical Field

This disclosure generally relates to a semiconductor package having a reinforcement layer and a method of fabricating the semiconductor package.

2. Related Art

With the miniaturization of mobile devices, the thickness of semiconductor packages is gradually getting thinner. Accordingly, the mechanical strength of the semiconductor packages is weaker and can be easily broken.

SUMMARY

A semiconductor package in accordance with an embodiment of the present disclosure may include a substrate, a chip stack disposed on the substrate, the chip stack including a plurality of semiconductor chips, a plurality of bonding wires electrically connecting the substrate to the plurality of semiconductor chips, a reinforcement layer disposed on the chip stack, and a molding layer surrounding side surfaces of the chip stack and the bonding wires and contacting side surfaces of the reinforcement layer. The reinforcement layer may include a lower layer including an adhesive, an intermediate layer disposed on the lower layer, and an upper layer disposed on the intermediate layer. The intermediate layer may have elongation in a range of 5% to 70%. The upper layer may have elongation less than 5%.

A semiconductor package in accordance with an embodiment of the disclosure may include a substrate; a chip stack disposed on the substrate, the chip stack including a plurality of semiconductor chips; bonding wires electrically connecting the substrate to the plurality of semiconductor chips; a reinforcement layer disposed on the chip stack; and a molding layer being in contact with side surfaces of the reinforcement layer, the molding layer surrounding side surfaces of the chip stack and the bonding wires. The reinforcement layer may include a lower layer, an intermediate layer on the lower layer, and an upper layer on the intermediate layer. The lower layer may include an adhesive film. The intermediate layer may include a first polymeric resin. The upper layer may include a second polymeric resin, silica filler, and carbon. The first polymeric resin may be different from the second polymeric resin. The intermediate layer may be relatively softer than the upper layer. The upper layer may be relatively harder than the intermediate layer.

A semiconductor package in accordance with an embodiment of the present disclosure may include a substrate, a chip stack disposed on the substrate, the chip stack including a plurality of semiconductor chips, a plurality of bonding wires electrically connecting the substrate to the plurality of semiconductor chips, a reinforcement layer disposed on the chip stack, and a molding layer surrounding side surfaces of the chip stack and the bonding wires and contacting side surfaces of the reinforcement layer. The reinforcement layer may include a lower layer including an adhesive, an intermediate layer disposed on the lower layer, and an upper layer disposed on the intermediate layer. The intermediate layer may be more flexible than the upper layer.

DETAILED DESCRIPTION

Various examples and embodiments of the disclosed technology are described below in detail with reference to the accompanying drawings. The drawings might not be necessarily to scale and in some instances, proportions of at least some of structures in the drawings may have been exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The disclosure provides a semiconductor package having good toughness. For example, the semiconductor package in accordance with an embodiment of the disclosure may have better toughness than a conventional semiconductor package without a reinforcement layer. Therefore, the semiconductor package in accordance with the embodiment can have excellent anti-break ability against physical impact.

Figure 1:
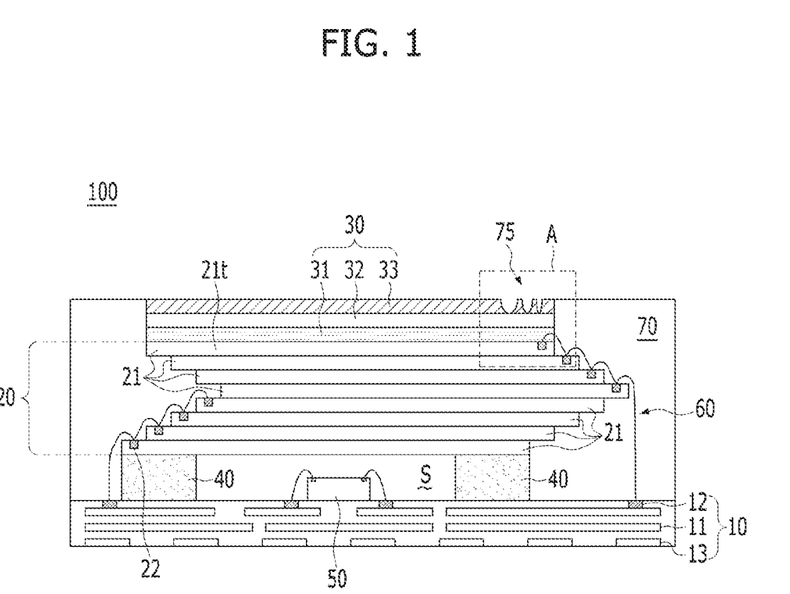
FIG. 1 is a side view illustrating a semiconductor package in accordance with an embodiment of the disclosure.
Figure 2:
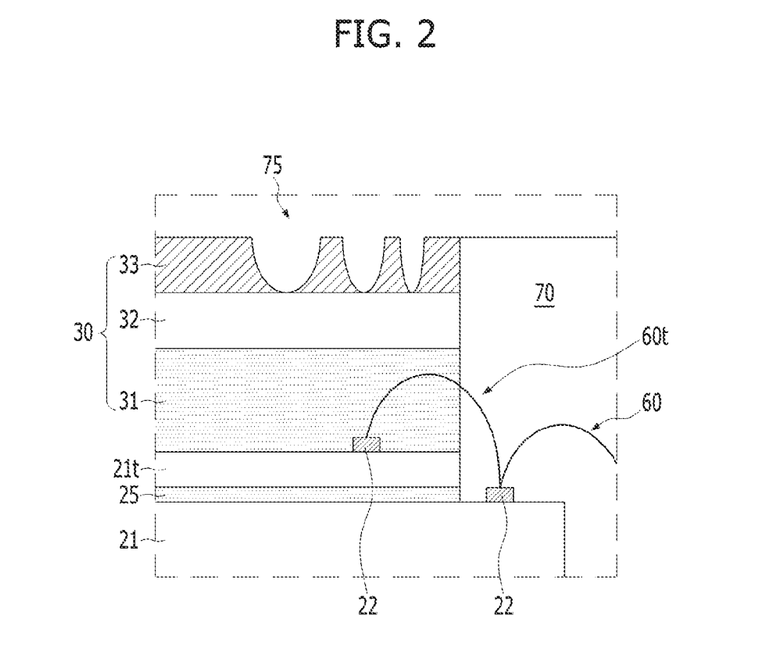
FIG. 2 is an enlarged view illustrating the region A of FIG. 1.

FIG. 1 is a side view illustrating a semiconductor package 100 in accordance with an embodiment of the disclosure. FIG. 2 is an enlarged view illustrating the region A of FIG. 1.

Referring to FIGS. 1 and 2, the semiconductor package 100 may include a substrate 10, a chip stack 20, a reinforcement layer 30, and a molding layer 70. The semiconductor package 100 may further include bonding wires 60. The semiconductor package 100 may further include supporters 40 and a controller 50.

The substrate 10 may include a printed circuit board (PCB). The substrate 10 may include a plurality of substrate interconnections 11, a plurality of top pads 12, and a plurality of bottom pads 13. The substrate interconnections 11 may transfer electrical signals inside of the substrate 10. For example, the substrate interconnections 11 may electrically connect the top pads 12 to the bottom pads 13. The top pads 12 may directly and electrically connect some of the substrate interconnection 11 to some of the bonding wires 60. In one embodiment, the top pads 12 may include bond fingers. The bottom pads 13 may electrically connect some of the substrate interconnections 11 to a mother board or an external system. For example, the bottom pads 13 may be electrically connected to a mother board or an external system through metal bumps or solder balls. The substrate interconnections 11, the top pads 12, and the bottom pads 13 may include a metal such as copper (Cu). In one embodiment, the substrate 10 may include a re-distribution layer (RDL). For example, the substrate 10 may include insulating materials such as silicon oxide or silicon nitride surrounding the substrate interconnections 11. In one embodiment, the substrate 10 may include an interposer. For example, the substrate 10 may include an insulating material such as a plastic, a ceramic, or a polymeric organic material surrounding the substrate interconnections 11.

The chip stack 20 may include a plurality of semiconductor chips 21 stacked in a staircase. The semiconductor chips 21 may be adhered and stacked using an adhesive layer such as a die attach film (DAF). In one embodiment, at least one of the semiconductor chips 21 may include a NAND flash memory. Each the semiconductor chips 21 may include a chip pad 22 exposed on a portion of an exposed top surface. The chip pads 22 may be disposed closer to one side edge of the corresponding semiconductor chips 21, respectively. In one embodiment, the chip pads 22 may be disposed closer to two opposite side edges of the corresponding semiconductor chips 21.

The bonding wires 60 may electrically connect the chip pads 22 of the semiconductor chips 21 to the top pads 12 of the substrate 10. The semiconductor chips 21 may be electrically connected with each other through the bonding wires 60.

The reinforcement layer 30 may be disposed on the topmost semiconductor chip 21t of the semiconductor chips 21 of the chip stack 20. Side surfaces of the reinforcement layer 30 and side surfaces of the topmost semiconductor chip 21t may be vertically aligned. In one embodiment, at least one of the side surface of the reinforcement layer 30 and at least one of the side surfaces of the topmost semiconductor chip 21t may be vertically aligned. In the figure, the two side surfaces of the reinforcement layer 30 and the two-side surface of the topmost semiconductor chip 21t are vertically aligned. In one embodiment, the sidewalls of the reinforcement layer might not be aligned with the sidewalls of the topmost semiconductor chip 21t. For example, a bottom surface of the reinforcement layer 30 may be exposed such as eaves or overhangs. In other words, edge portions of a top surface of the topmost semiconductor chip 21t may be partially exposed and not covered by the reinforcement layer 30.

The reinforcement layer 30 may include a lower layer 31, an intermediate layer 32 stacked and disposed on the lower layer 31, and an upper layer 33 stacked and disposed on the intermediate layer 32.

The lower layer 31 may be an adhesive film having adhesiveness. In one embodiment, the lower layer 31 may include an adhesive. The lower layer 31 may be adhered with a top surface of the topmost semiconductor chip 21t of the stacked semiconductor chips 21 of the chip stack 20. The lower layer 31 may include an epoxy resin. The lower layer 31 may further include an acryl resin. The lower layer 31 may include at least one of the epoxy resin or the acryl resin. The reinforcement layer 30 and the top surface of the topmost semiconductor chip 21t of the chip stack 20 may be directly adhered with each other. The lower layer 31 may be a thermosetting resin. The lower layer 31 may be soft to allow a portion of the bonding wire 60 connected to the uppermost semiconductor chip 21t to penetrate the lower layer 31 before curing. Accordingly, a portion of the topmost bonding wire 60t of the bonding wires 60 which is connected to the topmost semiconductor chip 21t may be impregnated in the lower layer 31. For example, the topmost bonding wire 60t of the bonding wires 60 may be partially impregnated, inserted, embedded, concealed, or buried in the lower layer 31. The lower layer 31 may have sufficient thickness to allow portions of the bonding wires 60 to be impregnated, inserted, embedded, concealed, or buried. For example, the lower layer 31 may have a thickness about 30 μm or more. In one embodiment, the lower layer 31 may have a thickness in a range of about 30 μm to 120 μm.

The intermediate layer 32 may include at least one of a more flexible material and softer material than the upper layer 33. In an embodiment, the intermediate layer 32 may be more flexible than the upper layer 33. In an embodiment, the intermediate layer 32 may be softer than the upper layer 33. For example, the intermediate material 32 may have elongation in a range of about 5% to 70%. In an embodiment, an amount of extension of the intermediate material 32 under stress may be in the range of about 5% to 70% of the intermediate material's 32 original length before the intermediate material 32 is ruptured. In an embodiment, the intermediate material 32 may have an elongation at break between about 5% to about 70%. In an embodiment, the intermediate material 32 may have an elongation at break between about 5% to about 70% of the intermediate material's 32 initial size before the intermediate material 32 is ruptured. In addition, the intermediate layer 32 may have high heat-resistance so that a laser of a marking process does not deform some of the bonding wires 60 in the lower layer 31. For example, the intermediate layer 32 can block or mitigate heat generated from laser light from being transferred from the upper layer 33 to the lower layer 31. That is, the intermediate layer 32 may prevent or mitigate heat generated from laser light from damaging the bonding wire 60.

The intermediate layer 32 may have adhesiveness for proper adhesion with the upper layer 33. The intermediate layer 32 may include a first polymeric resin different from the epoxy resin. For example, the first polymeric resin may include at least one of polyimide (PI), polybenzoxazole (PBO), benzocyclobuten (BCB), polyethylene naphthalate (PEN), polyethylene terephthalate (PET), or polyether ether ketone (PEEK). The intermediate layer 32 may have an appropriate thickness to absorb and relieve external stress. For example, the intermediate layer 32 may have a thickness of 10 μm or more. In one embodiment, the intermediate layer 32 may have a thickness in a range of 10 μm to 40 μm.

Figure 4:
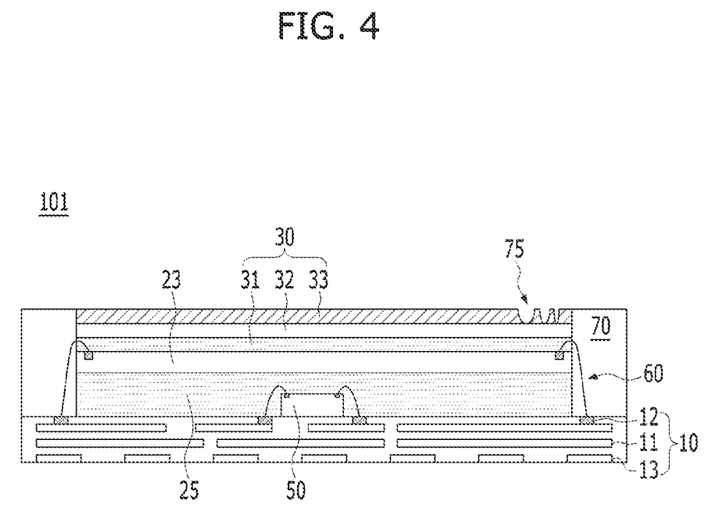
FIG. 4 is a side cross-sectional view illustrating a semiconductor package in accordance with an embodiment of the present disclosure.

The upper layer 33 may include a relatively harder and more rigid material than the intermediate layer 32. The upper layer 33 may have elongation of less than 5%. In an embodiment, an amount of extension of the upper layer 33 under stress may be less than about 5% of the upper layer's 33 original length before the upper layer 33 is ruptured. In an embodiment, the upper layer 33 may have an elongation at break at greater than 5%, In an embodiment, the upper layer 33 may have an elongation at break at greater than 5% of the upper layer's 33 initial size before the upper layer 33 is ruptured. In one embodiment, the upper layer 33 may have a hardness and strength substantially similar to the molding layer 70. The upper layer 33 may include a second polymeric resin and silica fillers. The first polymeric resin and the second polymeric resin may include a different material from each other. For example, the second polymer resin may include an epoxy resin. The upper layer 33 may further include carbon. For example, the upper layer 33 may include epoxy resin, silica fillers, and carbon. The upper layer 33 may include a mark 75. The mark 75 may include a package ID, a bar code, or a quick response (QR) code. The mark 75 may have a longitudinal section of a shape recessed by a laser marking process, for example, a trench shape. In an embodiment, the mark 75 may include a mark having at least one trench. In an embodiment, the mark 75 may include a mark having at least one trench as shown in FIGS. 1, 2, and 4. The upper layer 33 may have a color substantially the same as or similar to the molding layer 70, for example, black. Therefore, a boundary between the upper layer 33 of the reinforcement layer 30 and the molding layer 70 may be hardly distinguished visually. In general, the mark 75 may be marked or engraved in the molding layer 70. The molding layer 70 may have a dark color, i.e., black color to absorb the laser used in the marking process. In the embodiment, the upper layer 33 may have the dark color, i.e., black color to sufficiently absorb the laser in the marking process.

In one embodiment, the intermediate layer 32 may be exposed on the bottom of the mark 75. For example, in an embodiment, the intermediate layer 32 may be exposed through a trench of a mark without a bottom surface. The upper layer 33 may have an appropriate thickness to protect the chip stack 20 of the semiconductor package 100 from external impact. For example, the upper layer 33 may have a thickness of 10 μm or more. In one embodiment, the upper layer 33 may have a thickness in the range of 10 μm to 40 μm.

In general, materials having high hardness and strength have high brittleness, and are thus likely to crack or break. Since the reinforcement layer 30 in accordance with the embodiment of the disclosure includes the intermediate layer 32 having flexibility and high elongation, it is possible to increase the toughness of the upper layer 33. That is, the intermediate layer 32 can absorb or relieve external impact and physical stress.

The molding layer 70 may be provided on the substrate 10 to surround side surfaces of the chip stack 20 and to contact or abut side surfaces of the reinforcement layer 30. The upper surface of the reinforcement layer 30 may be exposed without being covered with the molding layer 70. The top surface of the reinforcing layer 30 and the top surface of the molding layer 70 may be coplanar. The molding layer 70 may include an epoxy molding compound (EMC). For example, the molding layer 70 may include an epoxy resin, silica fillers, and carbon. As mentioned above, the molding layer 70 may have a black color. The molding layer 70 may have adhesiveness. The molding layer 70 may supplement the adhesion between the intermediate layer 32 and the upper layer 33 of the reinforcement layer 30.

The supporters 40 may provide a shaded space (S) by spacing apart the chip stack 20 from the upper surface of the substrate 10. In an embodiment, the supporters 40 may provide a space (S) that is overlapped by the chip stack 20 and formed by spacing apart the chip stack 20 from the upper surface of the substrate 10. The supporters 40 may include at least one of a dummy semiconductor chip, an insulating pillar, or an insulating dam. In one embodiment, a thermosetting polymeric material such as a film on die (FOD), an underfill material, or an insulating material such as the epoxy molding compound (EMC) may be provided in the shaded space S. In one embodiment, the shaded space S may be an empty space. The controller 50 may be disposed in the shaded space S. Although reference numerals are omitted, some of the pads of the controller 50 and the upper pads 12 of the substrate 10 may be electrically connected with each other using a wire.

In one embodiment, an insulating material covering the controller 50 mounted on the substrate 10 may be provided, and the chip stack 20 may be stacked on the insulating material. The insulating material may include a thermosetting polymeric material such as the FOD or an FOW (film over wire).

The top bonding wire 60t partially impregnated in the lower layer 31 can be protected from thermal deformation or thermal/physical damage (bending or breaking). In an embodiment, the top bonding wire 60t partially embedded in the lower layer 31 can be protected from thermal deformation or thermal/physical damage (bending or breaking). Since the intermediate layer 32 can block the heat transmitted from the upper layer 33 to the lower layer 31, the lower layer 31 and the upper bonding wire 60t can be protected from thermal stress by the intermediate layer 32. For example, the top bonding wire 60t may have a substantially same curved shape as other bonding wires 60. The lowermost bonding wire 60 may have various shapes depending on package types.

Figure 3A:
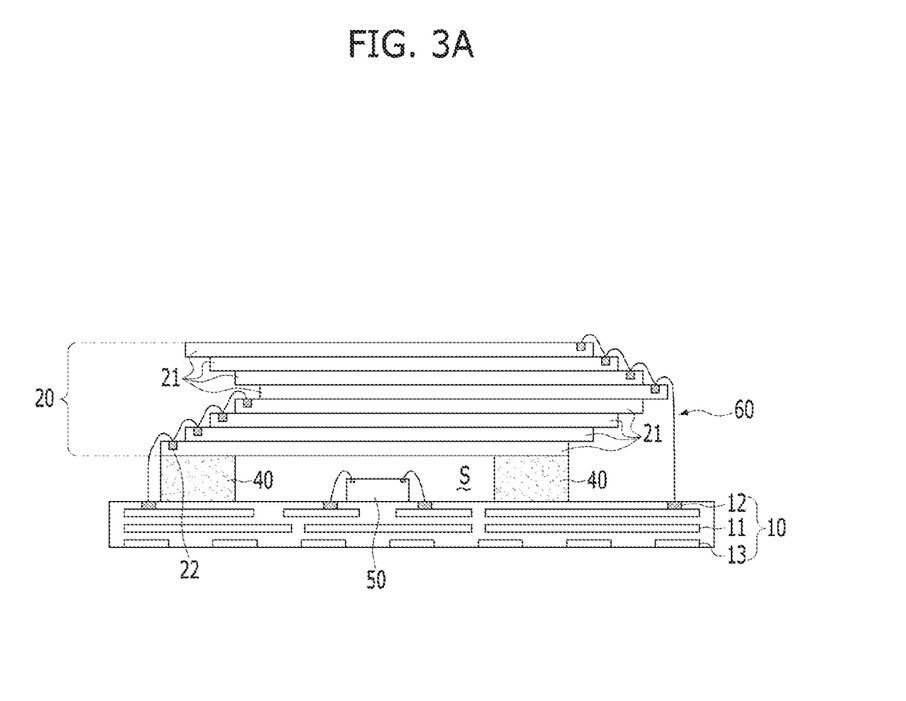
FIGS. 3A, 3B, 3C, and 3D schematically illustrate a method of manufacturing a semiconductor package in accordance with an embodiment of the present disclosure.

FIGS. 3A to 3D schematically illustrate a method of manufacturing a semiconductor package in accordance with an embodiment of the present disclosure. Referring to FIG. 3A, the method may include performing a mounting process to mount a controller 50 on a substrate 10, dispose supporters 40 on the substrate 10, and dispose a chip stack 20 on the supporters 40. The substrate 10 may include substrate interconnections 11, upper pads 12, and lower pads 13. The chip stack 20 may include a plurality of semiconductor chips 21. The semiconductor chips 21 may be stacked in a staircase and a zigzag shape. The method may further include performing a wire bonding process to connect the chip pads 22 of the semiconductor chips 21 of the chip stack 20 in parallel with each other by using the bonding wires 60. The chip pads 22 may be electrically connected to the upper pads 12 of the substrate 10 through the bonding wires 60. In one embodiment, the support 40 may be omitted. In one embodiment, the method may include covering the controller 50 with an adhesive film such as the FOD or FOW, and mounting the chip stack 20 on the FOD or FOW.

Figure 3B:
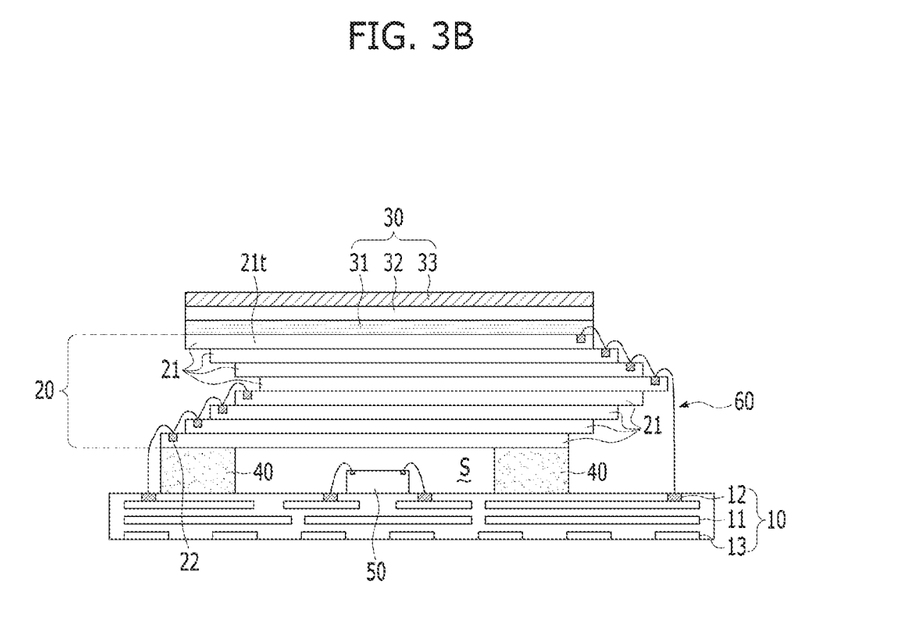

Referring to FIG. 3B, the method may include performing a reinforcing process to form a reinforcement layer 30 on the chip stack 20. The reinforcing process may include performing an adhesion process and a curing process. The adhesion process may include providing a reinforcement layer 30 in a film form on the top surface of the topmost semiconductor chip 21t and applying pressure to the reinforcement layer 30 to adhere the reinforcement layer 30 on the top surface of the topmost semiconductor chip 21t. For example, the bonding process may include applying pressure in a range of about 0.5 kgf/cm2 to 3.0 kgf/cm2 to the reinforcement layer 30 and heating the lower layer 31 of the reinforcement layer 30 to a temperature in a range of about 80° C. to 150° C. The curing process may include heating the lower layer 31 of the reinforcement layer 30 to a temperature in the range of about 100° C. to 180° C. In one embodiment, the reinforcement layer 30 may be preliminary cured or on top surface of the chip stack 20 by the reinforcement process. In one embodiment, the curing process can be omitted. That is, since the lower layer 30 is not cured, the reinforcement layer 30 may be in a weakly bonded state, for example, in a weakly cured state.

Figure 3C:
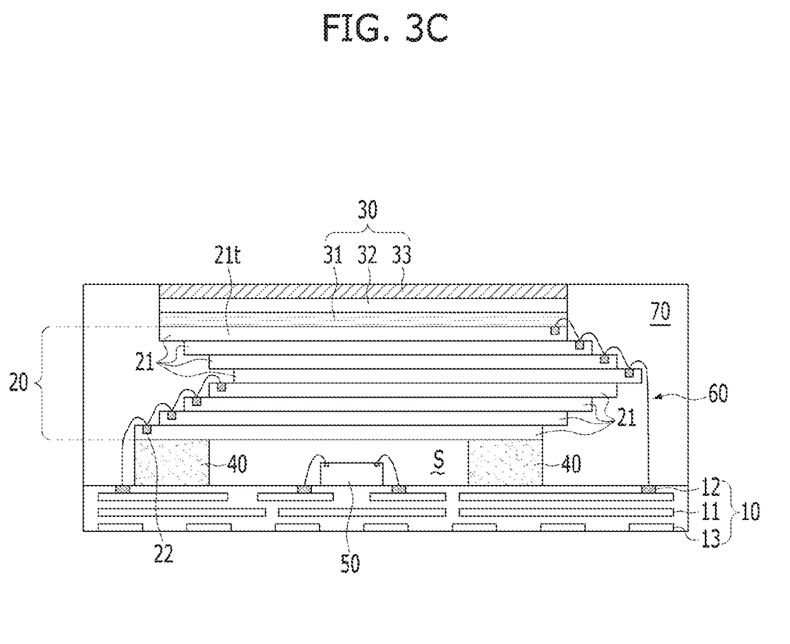

Referring to FIG. 3C, the method may include performing a molding process to form a molding layer 70. The molding process may include providing a molding material surrounding the chip stack 20, the reinforcement layer 30, and the bonding wires 60, and heating and curing the molding material to form the molding layer 70. In one embodiment, during the molding process, the lower layer 31 of the reinforcement layer 30 may be completely cured.

Figure 3D:
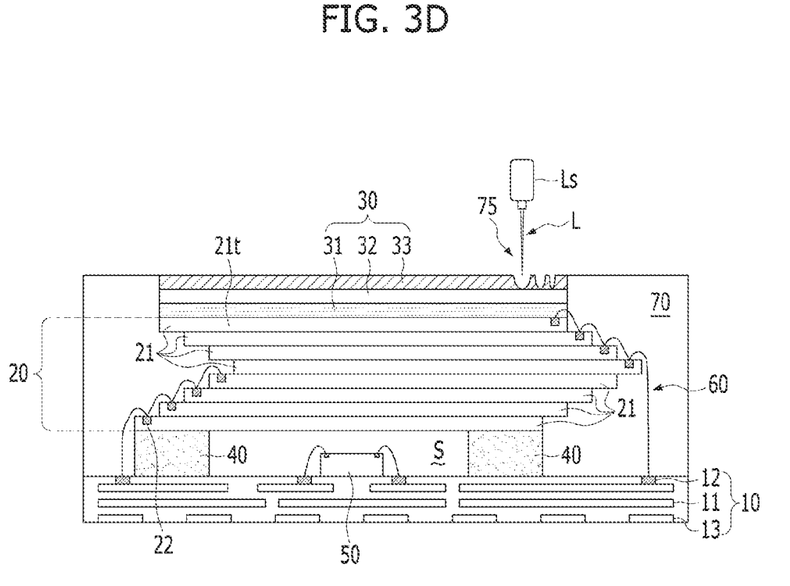

Referring to FIG. 3D, the method may further include performing a marking process using a laser light source Ls to engrave a mark 75 on the upper layer 33 of the reinforcement layer 30. Recesses or trenches may be formed in the upper layer 33 by the marking process. The intermediate layer 32 may be exposed at the bottom of the recesses or trenches. For example, irradiated portions of the upper layer 33 with the laser L may be removed during the marking process. The intermediate layer 32 may block or mitigate spreading thermal energy of the laser L to the lower layer 31 and the bonding wire 60. Accordingly, the intermediate layer 32 can prevent the lower layer 31 and the bonding wire 60 from being damaged by the thermal energy of the laser L.

FIG. 4 is a side cross-sectional view illustrating a semiconductor package 101 in accordance with an embodiment of the present disclosure. Referring to FIG. 4, the semiconductor package 101 in accordance with an embodiment of the present disclosure may include a substrate 10, a controller 50, a die adhesive layer 25, a semiconductor chip 23, a reinforcement layer 30, and a molding layer 70. The controller 50 may be directly mounted on the substrate 10. The die adhesive layer 25 may cover the controller 50. For example, the die adhesive layer 25 may include the film on die (FOD) or the film over wire (FOW). The semiconductor chip 23 may be disposed on the die adhesive layer 25. In one embodiment, the semiconductor chip 23 may include a plurality of stacked semiconductor chips. The controller 50 and the semiconductor chip 23 may be electrically connected to top pads 12 of the substrate 10 through bonding wires 60. The semiconductor chip 23 may include one or more NAND flash memories. In one embodiment, the semiconductor chip 23 may include a plurality of stacked semiconductor memory chips. Elements not described may be understood with reference to other drawings.

Figure 5:
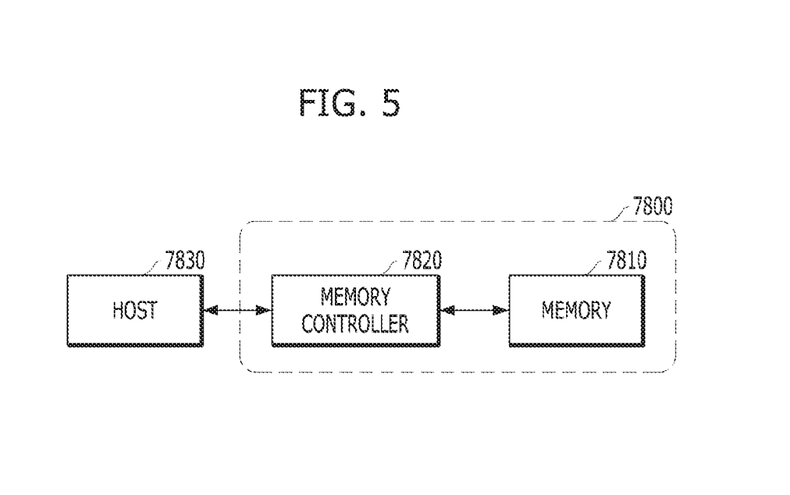
FIG. 5 shows a block diagram illustrating an electronic system employing a memory card including a semiconductor package, according to an embodiment of the present disclosure.

FIG. 5 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages 100 and 101 according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 6:
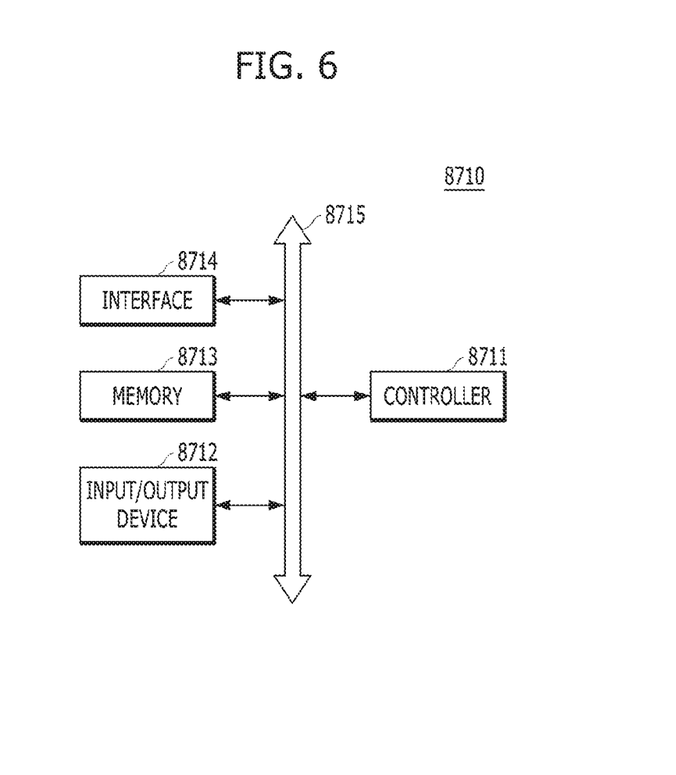
FIG. 6 shows a block diagram illustrating another electronic system including a semiconductor package, according to an embodiment of the present disclosure.

FIG. 6 shows a block diagram illustrating an electronic system 8710 including at least one of the semiconductor packages 100 and 101 according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages 100 and 101 according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid-state drive (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

While this disclosure contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments. Only a few embodiments and examples are described. Other embodiments, enhancements and variations can be made based on what is described and illustrated in this patent document.

What is claimed is:

1. A semiconductor package comprising:
    a substrate;
    a chip stack disposed on the substrate, the chip stack including a plurality of semiconductor chips;
    a plurality of bonding wires electrically connecting the substrate to the plurality of semiconductor chips;
    a reinforcement layer disposed on the chip stack; and
    a molding layer surrounding side surfaces of the chip stack and the bonding wires and contacting side surfaces of the reinforcement layer,
    wherein the reinforcement layer comprises:
    a lower layer including an adhesive;
    an intermediate layer disposed on the lower layer, the intermediate layer having elongation in a range of 5% to 70%; and
    an upper layer disposed on the intermediate layer, the upper layer having elongation of less than 5%.

2. The semiconductor package of claim 1, wherein the upper layer includes at least one of an epoxy resin, silica filler, and carbon.

3. The semiconductor package of claim 1, wherein the upper layer includes a mark having a trench shape.

4. The semiconductor package of claim 3, wherein the intermediate layer is exposed at a bottom of the mark.

5. The semiconductor package of claim 1, wherein a topmost bonding wire of the bonding wires is embedded in the lower layer.

6. The semiconductor package of claim 1, wherein the intermediate layer includes one or more of polyimide, polybenzoxazole, benzocyclobutene, polyethylene naphthalate, polyethylene terephthalate, and polyether ether ketone.

7. The semiconductor package of claim 1, wherein the lower layer is directly adhered to a top surface of a topmost semiconductor chip stacked at a top level of the stacked semiconductor chips of the chip stack.

8. The semiconductor package of claim 1, wherein the lower layer includes at least one of epoxy resin and acryl resin.

9. The semiconductor package of claim 1, wherein the reinforcement layer has a thickness in a range of 50 µm to 200 µm.

10. The semiconductor package of claim 9, wherein:
    the lower layer of the reinforcement layer has a thickness in a range of 30 µm to 120 µm,
    the intermediate layer of the reinforcement layer has a thickness in a range of 10 µm to 40 µm, and
    the upper layer of the reinforcement layer has a thickness in a range of 10 µm to 40 µm.

11. The semiconductor package of claim 1, wherein a top surface of the molding layer and a top surface of the reinforcement layer are substantially coplanar.

12. The semiconductor package of claim 1, wherein the upper layer of the reinforcement layer and the molding layer have a substantially same color.

13. The semiconductor package of claim 1, further comprising:
    supporters being spaced apart the chip stack from the substrate to provide a space between a top surface of the substrate and a bottom surface of the chip stack; and
    a controller disposed in the space.

14. The semiconductor package of claim 13, wherein the supporters include one or more of a dummy chip, an insulating pillar, and an insulating dam.

15. The semiconductor package of claim 1, further comprising:
    a controller disposed on the substrate; and
    an insulating material covering the controller,
    wherein the chip stack is stacked on the insulating material.

16. A semiconductor package comprising:
    a substrate;
    a chip stack disposed on the substrate, the chip stack including a plurality of semiconductor chips;
    bonding wires electrically connecting the substrate to the plurality of semiconductor chips;
    a reinforcement layer disposed on the chip stack; and
    a molding layer being in contact with side surfaces of the reinforcement layer, the molding layer surrounding side surfaces of the chip stack and the bonding wires,
    wherein the reinforcement layer comprises a lower layer, an intermediate layer on the lower layer, and an upper layer on the intermediate layer,
    wherein:
    the lower layer includes an adhesive film,
    the intermediate layer includes a first polymeric resin,
    the upper layer includes a second polymeric resin, silica filler, and carbon,
    the first polymeric resin is different from the second polymeric resin,
    the intermediate layer is relatively softer than the upper layer, and
    the upper layer is relatively harder than the intermediate layer.

17. The semiconductor package of claim 16, wherein:
    the first polymeric resin includes one or more of polyimide, polybenzoxazole, benzocyclobutene, polyethylene naphthalate, polyethylene terephthalate, and polyether ether ketone, and
    the second polymeric resin includes epoxy resin.

18. The semiconductor package of claim 16, wherein:
    the intermediate layer has an elongation break more than 5%, and
    the upper layer has an elongation break less than 5%.

19. The semiconductor package of claim 16, wherein a portion of a topmost bonding wire of the bonding wires is embedded in the lower layer.

20. A semiconductor package comprising:
    a substrate;
    a chip stack disposed on the substrate, wherein the chip stack includes a plurality of semiconductor chips;
    a plurality of bonding wires electrically connecting the substrate to the plurality of semiconductor chips;
    a reinforcement layer disposed on the chip stack; and a molding layer surrounding side surfaces of the chip stack and the bonding wires and contacting side surfaces of the reinforcement layer,
wherein the reinforcement layer comprises:
a lower layer including an adhesive;
an intermediate layer disposed on the lower layer; and
an upper layer disposed on the intermediate layer,
wherein the intermediate layer is more flexible than the upper layer,
wherein an upper surface of the reinforcement layer is exposed without being covered with the molding layer, and
wherein the upper layer of the reinforcement layer includes a mark in a trench shape.

* * * * *